United States Patent [19]

Kim

[11] Patent Number: 6,088,113
[45] Date of Patent: Jul. 11, 2000

[54] FOCUS TEST MASK FOR PROJECTION EXPOSURE SYSTEM, FOCUS MONITORING SYSTEM USING THE SAME, AND FOCUS MONITORING METHOD

[75] Inventor: Young-chang Kim, Seoul, Rep. of Korea

[73] Assignee: Samsung Electronics Co., Ltd., Suwon, Rep. of Korea

[21] Appl. No.: 09/212,479

[22] Filed: Dec. 16, 1998

[30] Foreign Application Priority Data

Feb. 17, 1998 [KR] Rep. of Korea .......................... 98-4768
Sep. 1, 1998 [KR] Rep. of Korea ........................ 98-35855

[51] Int. Cl.$^7$ ............................ G01N 21/86; G01B 27/48
[52] U.S. Cl. ........................... 356/401; 250/548; 355/53; 355/77; 356/372
[58] Field of Search ................................. 356/372, 124, 356/399, 400, 401; 250/548; 355/53, 67, 71, 61

[56] References Cited

U.S. PATENT DOCUMENTS

| | | | |
|---|---|---|---|
| 4,908,656 | 3/1990 | Suwa et al. ............................... | 355/53 |
| 5,300,786 | 4/1994 | Brunner et al. .......................... | 250/548 |
| 5,952,132 | 9/1999 | King et al. ................................ | 430/22 |

*Primary Examiner*—Frank G. Font
*Assistant Examiner*—Layla Lauchman
*Attorney, Agent, or Firm*—Jones Volentine, L.L.P.

[57] ABSTRACT

A focus test mask for a projection exposure system, a focus monitoring system using the same, and a focus monitoring method include a transparent substrate and a focus test pattern formed on the substrate. The focus test pattern includes a first light shielding pattern and a second light shielding pattern placed inside the first light shielding pattern. Both light shielding patterns have fine protruding patterns arranged along edges of respective first and second closed geometric shapes defining the light shielding patterns. The focus test pattern projected onto the surface of the object allows quantitative measurement of the optimal focuses of the projection exposure system. By using the focus test mask for a projection exposure system, the optimal focuses of the projection exposure system can be periodically measured easily and precisely.

12 Claims, 12 Drawing Sheets

FIELD CURVATURE

FIG. 15

ASTIGMATISM

FOCUS TEST MASK FOR PROJECTION EXPOSURE SYSTEM, FOCUS MONITORING SYSTEM USING THE SAME, AND FOCUS MONITORING METHOD

CROSS-REFERENCES TO RELATED APPLICATIONS

The present application claims priority under 35 U.S.C. §119 to Korean Patent Application No. 98-4768 filed on Feb. 17, 1998 and to Korean Patent Application No. 98-35855 filed on Sep. 1, 1998, both of which are hereby incorporated by reference in their entirety.

BACKGROUND OF THE INVENTION

1. Field of the Invention

The present invention relates to a mask, and more particularly, to a focus test mask for a projection exposure system, a focus monitoring system using the same and a focus monitoring method.

2. Description of the Related Art

In photolithographic processes for manufacturing a semiconductor device, a critical dimension and a profile of a pattern change greatly depending on the degree of focus in a projection exposure system. The shorter the exposure wavelength is, the more severe the change is. Thus, focus measuring and maintenance of the projection exposure system is very important in photolithographic processes.

A currently used projection exposure system includes an auto focusing apparatus, to realize optimal focus during exposure. However, as the exposing process proceeds, optimal focus cannot be achieved in an actual pattern even though the automatic focusing apparatus detects the optimal focus, resulting in inferior patterns. Thus, the automatic focusing system must be corrected to an appropriate value periodically, to allow the optimal focus to be sensed. The change in a reference for sensing the optimal focus of the automatic focusing apparatus may result from a step of a wafer surface which is an object, and irregularity of a thin film formed on the wafer. Also, change in the reference for sensing optimal focus may result when a pattern is formed by a projection optical system while automatic focusing is performed by a separate optical system, which causes different correction between two optical systems.

According to a general method for measuring the optimal focus of the projection optical system, a pattern of a specific type is formed while changing focus in an exposure system, and then changes in the critical size and profile of the pattern are checked. However, such a method is time-consuming and unreliable, i.e., subjective, since the conclusions depend upon visual inspection by an operator using a scanning electron microscope, and are subject to variation between operators or even between separate viewings by the same operator.

Thus, a new method for measuring focus using an automatic measuring apparatus has been proposed. This method is disclosed in U.S. Pat. No. 5,300,786, and is based on a shift of pattern depending on the degree of focus shift when a phase mask is used. That is, the degree of defocusing is calculated by measuring the shifted value of the pattern. However, the method uses a phase shift mask, so that it cannot be applied to a typical mask, e.g., a light shielding pattern mask such as a binary chrome mask.

SUMMARY OF THE INVENTION

The present invention is therefore directed to a focus test mask, a system using the same and a focus monitoring method which substantially overcomes one or more of the problems due to the limitations and disadvantages of the related art.

It is a first objective of the present invention to provide a focus test mask for a projection exposure system, capable of easily measuring optimal focus of the projection exposure system, and which can be applied to a general light shielding pattern mask used for projection exposure process.

It is a second objective of the present invention to provide a focus monitoring system using the focus test mask.

It is a third objective of the present invention to provide a focus monitoring method using the focus test mask.

To achieve the first objective of the present invention, there is provided a focus test mask for a projection exposure system, including: a substrate which is transparent with respect to an illumination source; and a focus test pattern formed on the substrate, including a first light shielding pattern and a second light shielding pattern placed inside the first light shielding pattern. In the first light shielding pattern for the focus test, a plurality of fine protruding patterns are repeatedly arranged along an edge of a first quadrilateral shape. Also, in the second light shielding pattern, a plurality of fine protruding patterns are repeatedly arranged along an edge of a second quadrilateral shape which is placed inside the first closed geometric shape. The focus test pattern is projected onto the surface of an object, to allow quantitative measurement of the optimal focus of the projection exposure system.

Preferably, the first light shielding pattern for the focus test is arranged symmetrically about X- and Y-axes intersecting at the center of the first quadrilateral shape, and the second light shielding pattern for the focus test is arranged symmetrically about in X- and Y-axes intersecting at the center of the second quadrilateral shape. Also, preferably, the first light shielding pattern and the second light shielding pattern are arranged such that their fine protruding patterns point in opposite directions.

Preferably, the fine protruding pattern is a triangular or trapezoid pattern, or a line and space pattern.

Preferably, a complete focus test mask is formed by repeatedly arranging unit cells at a predetermined spacing, each of which includes a plurality of focus test patterns of different sizes.

To achieve the second objective of the present invention, there is provided a focus monitoring system for monitoring focus of a projection exposure system having an illumination source and a focus lens, the focus monitoring system including: a focus test mask and a displacement monitoring system for measuring displacement of a focus test pattern. The focus test mask is positioned between the illumination source and the focus lens, and has a substrate which is transparent with respect to an illumination source, and a focus test pattern which is formed on the substrate and includes a first light shielding pattern in which a plurality of fine protruding patterns are repeatedly arranged along an edge of a first quadrilateral shape, and a second light shielding pattern in which a plurality of fine protruding patterns are repeatedly arranged along an edge of a second quadrilateral shape which is placed inside the first quadrilateral shape. Here, the focus test pattern projected onto the surface of an object allows quantitative measurement of the optimal focus of the projection exposure system. Also, the displacement monitoring system measures displacement of the focus test pattern projected onto the surface of the object via the focus lens.

Preferably, the displacement monitoring system is an automatic overlay metrology system capable of measuring the displacement of the focus test pattern projected onto the surface of the object.

To achieve the third objective of the present invention, there is provided a method for measuring focus in a projection exposure system, including loading a focus test mask having a focus test pattern above a focus lens of the projection exposure system. The focus test mask is exposed to project the focus test pattern onto the surface of the object through the focus lens, and then a displacement of the focus test pattern projected onto the surface of the object is measured. Preferably, the focus measuring method further includes calculating the optimal focus based on the relationship between the measured focus and the displacement after repeating the aforementioned steps while varying the focus of the focus lens.

According to the present invention, the optimal focus of the projection exposure system can be easily measured using an overlay metrology system, and since the result is immediately applied to an actual process, the time required for administering the optimal focus of the projection exposure system can be reduced.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

The present invention now will be described more fully with reference to the accompanying drawings, in which preferred embodiments of the invention are shown. This invention may, however, be embodied in many different forms, and should not be construed as being limited to the embodiments set forth herein; rather, these embodiments are provided so that this disclosure will be thorough and complete, and will fully convey the concepts of the invention to those skilled in the art. In the drawings, the shapes of focus test patterns are exaggerated for clarity. The same reference numerals in different drawings represent the same elements.

Figures 1A, 1B:
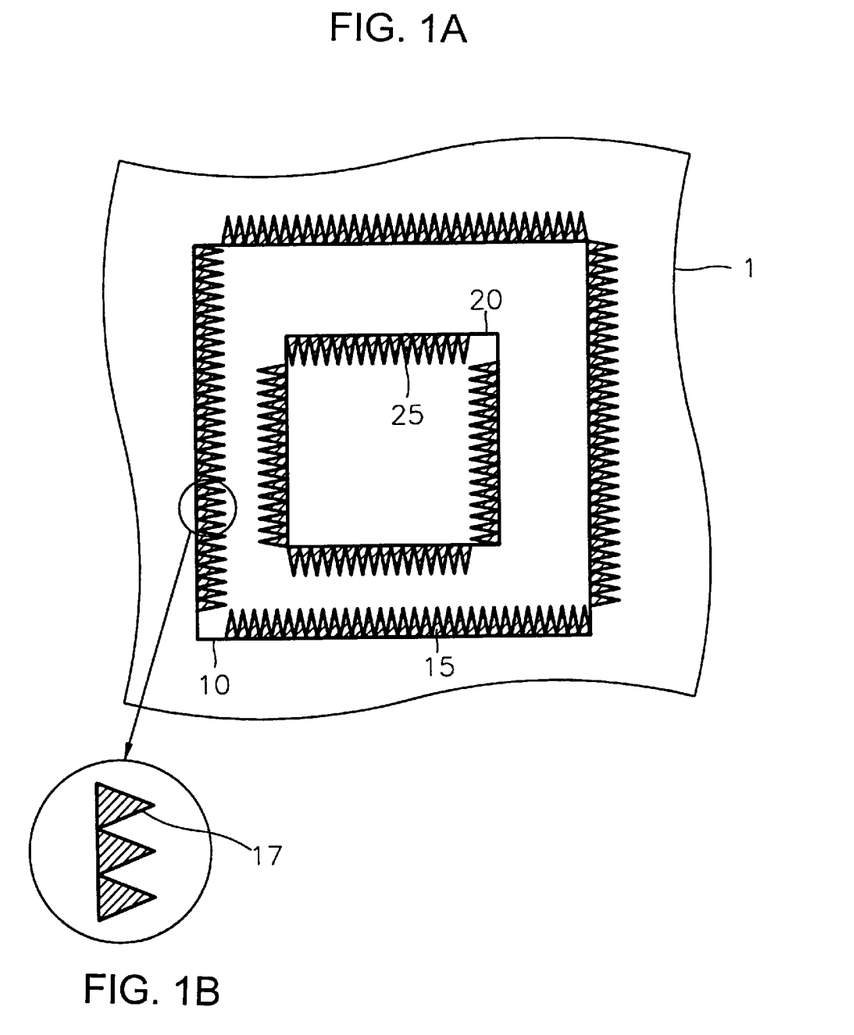
FIG. 1 is a plan view showing part of a focus test mask according to a first embodiment of the present invention.

Referring to FIG. 1, a focus test mask for a projection exposure system according to the present invention includes a substrate 1 which is transparent with respect to an illumination source, and a focus test light shielding pattern formed on the substrate 1. The focus test light shielding pattern includes a first light shielding pattern 15 and a second light shielding pattern 25.

In the first light shielding pattern 15, a plurality of fine protruding patterns 17 are arranged along an edge, of a first quadrilateral shape 10. Preferably, the first quadrilateral shape 10 is rectangular, and each of the fine protruding patterns 17 comes to a tip or point. For example, the fine protruding patterns 17 are triangular shapes or sharp ended trapezoids.

In the second light shielding pattern 25, a plurality of fine protruding patterns 17 are repeatedly arranged along an edge of a second quadrilateral shape 20, inside the first quadrilateral shape 10. Preferably, the second quadrilateral shape 20 is formed to the same form as the first closed geometric shape 10, the fine protruding patterns are of the same shape as those of the first light shielding pattern, and the plurality of fine protruding patterns are arranged along edge of the second quadrilateral shape.

Preferably, the first and the second quadrilateral shapes 10 and 20 are arranged such that their centers coincide with each other. Also, the first light shielding pattern 15 is arranged symmetrically about X- and Y-axes intersecting at the center of the first quadrilateral shape 10, and the second light shielding pattern 25 is also arranged symmetrically about X- and Y-axes intersecting at the center of the second closed geometric shape 20. Also, the first light shielding pattern 15 and the second light shielding pattern 25 are arranged so their fine protruding patterns 17 point in opposite directions. Further, the first or second light shielding pattern can be respectively placed on the edges of the first or second quadrilateral shape such that at least one of the corners of the first or second quadrilateral shape is open.

Figure 2A:
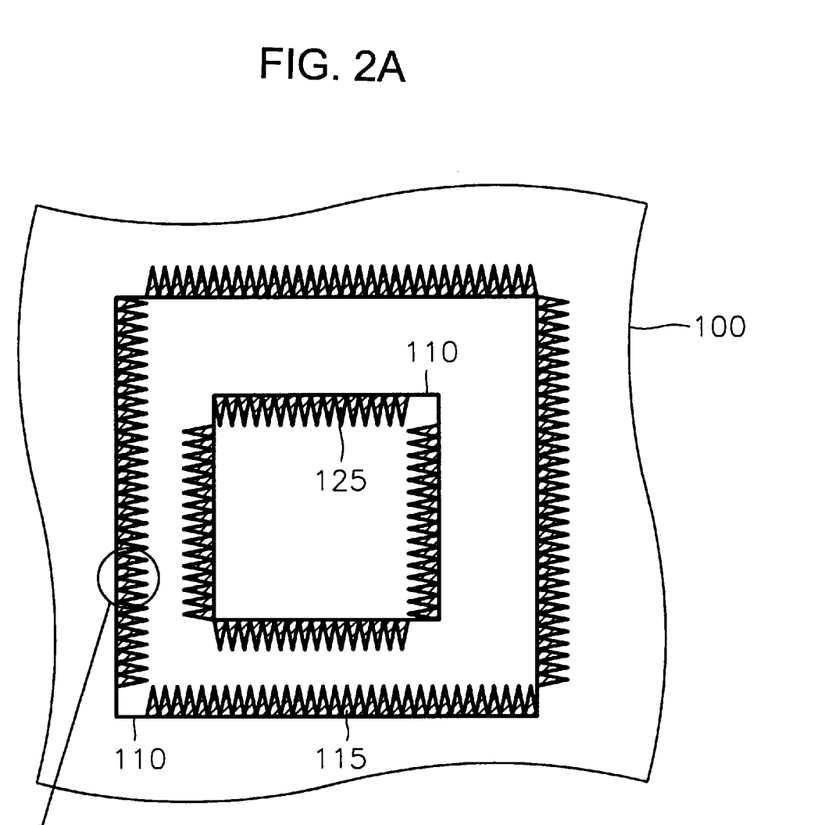
FIG. 2 is a plan view showing a test pattern projected on an object using the mask of FIG. 1 and a projection exposure system, in the state of optimal focus.
Figure 2B:
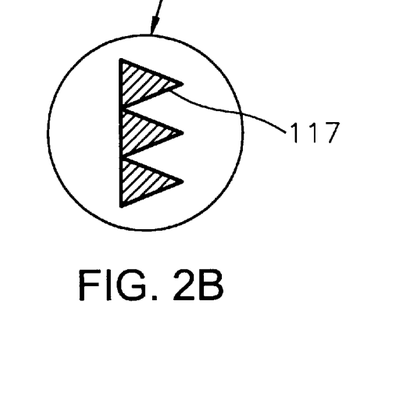

When projecting the first and second light shielding patterns 15 and 25 onto an object, e.g., a wafer 100 on which a photoresist film is deposited, in the state of optimal focus, using the mask of FIG. 1 and a general projection exposure system, first and second projected patterns 115 and 125 each having exact critical dimension and excellent profile are formed along the edges of the first and second closed geometric shapes 110 and 120, respectively, as shown in FIG. 2.

Figure 3A:
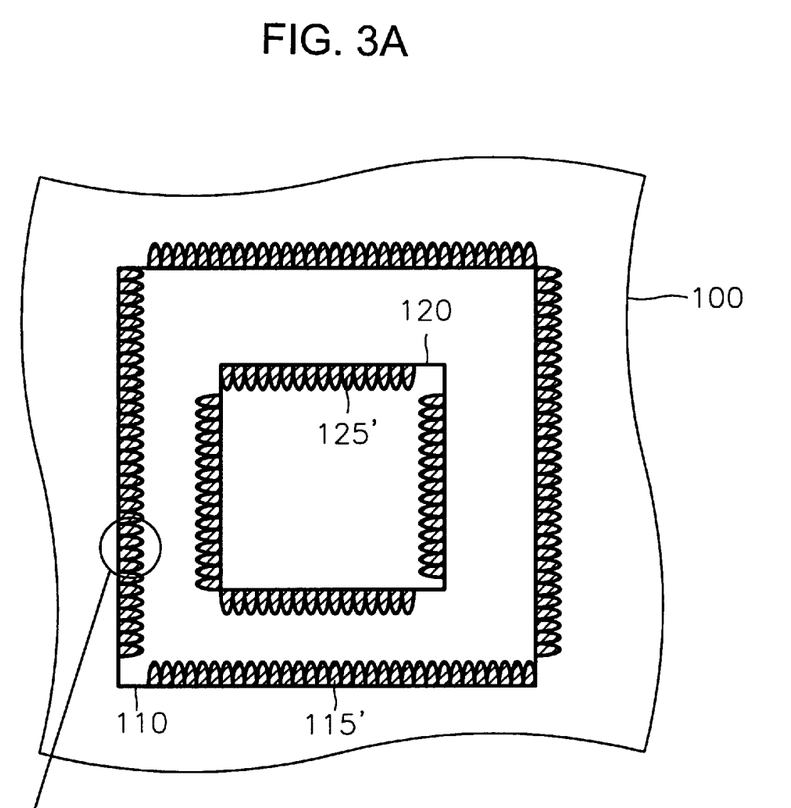
FIG. 3 is a plan view showing a test pattern projected on an object using the mask of FIG. 1 and a projection exposure system, in a state of defocus.
Figure 3B:
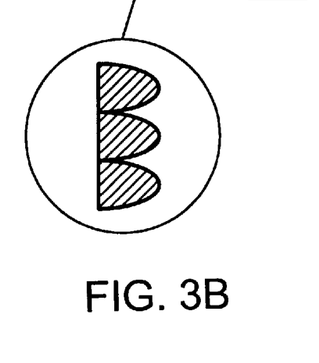

When defocusing occurs in the projection exposure system, line shortening occurs, in which the tips of the patterns become dull. The line shortening is serious at the sharp portion of the pattern. Thus, as shown in FIG. 3, in the defocused state, the first and second deformed projection patterns 115' and 125' have shorter tips than the normal patterns, i.e., patterns at optimal focus.

In comparison with the normal first and second projection patterns 115 and 125, the first deformed projection pattern 115' is shifted down or to the left, and the second projection pattern 125' is shifted up or to the right, with respect to the normal patterns.

Also, the degree of displacement of the first and second deformed projection patterns 115' and 125' depend on the degree of defocus. Thus, displacement of the deformed second projection pattern 125' with respect to the first projection pattern 115' is measured by comparing the deformed patterns 115' and 125' with the normal patterns 115 and 125 while defocusing in the X-axis direction Then, a curve obtained by substituting focus for a variable x and displacement for a variable y is approximated to a second-order curve, in order to find x which minimizes y. The obtained x value corresponds to the optimal focus.

In detail, relationship between the focus and the displacement value can be expressed by the following equation (1).

$$y = ax^2 + bx + c \quad (1)$$

Thus, the following equations are obtained by measuring the displacement values by varying the variable x from $x_1$ to $x_j$.

$$y_1 = ax_1^2 + bx_1 + c$$

$$y_2 = ax_2^2 + bx_2 + c$$

$$y_1 = ax_j^2 + bx_j + c$$

The above equations can be expressed by the following matrix (2).

$$\begin{pmatrix} 1 & x_1 & x_1^2 \\ 1 & x_2 & x_2^2 \\ \vdots & & \\ 1 & x_j & x_j^2 \end{pmatrix} \begin{pmatrix} c \\ b \\ a \end{pmatrix} = \begin{pmatrix} y_1 \\ y_2 \\ \vdots \\ y_j \end{pmatrix} + E \quad (2)$$

In above matrix, E is an allowable error value. The matrix is simplified to (X)(A)=Y. Here, A capable of minimizing error can be expressed by the following equation (3).

$$A = (X^T \cdot X)^{-1} X \cdot Y \quad (3)$$

Thus, when coefficients a and b of the second-order equation are given by the above equation (3),x which minimizes y, that is, the optimal focus value, which is equal to −b/2a can be calculated.

After calculating the optimal focus in the X-axis direction, an optimal focus in the Y-axis direction is calculated by the same method as for the X-axis direction.

When the optimal focuses in the X- and Y-axis directions are obtained, the best focus at a point of the exposure field can be calculated by the following equation (4).

optimal focus=(optimal focus in X-axis+optimal focus in Y-axis)/2 (4)

Also, astigmatism is expressed by the following equation (5).

astigmatism=optimal focus in X-axis−optimal focus in Y-axis (5)

Figure 4A:
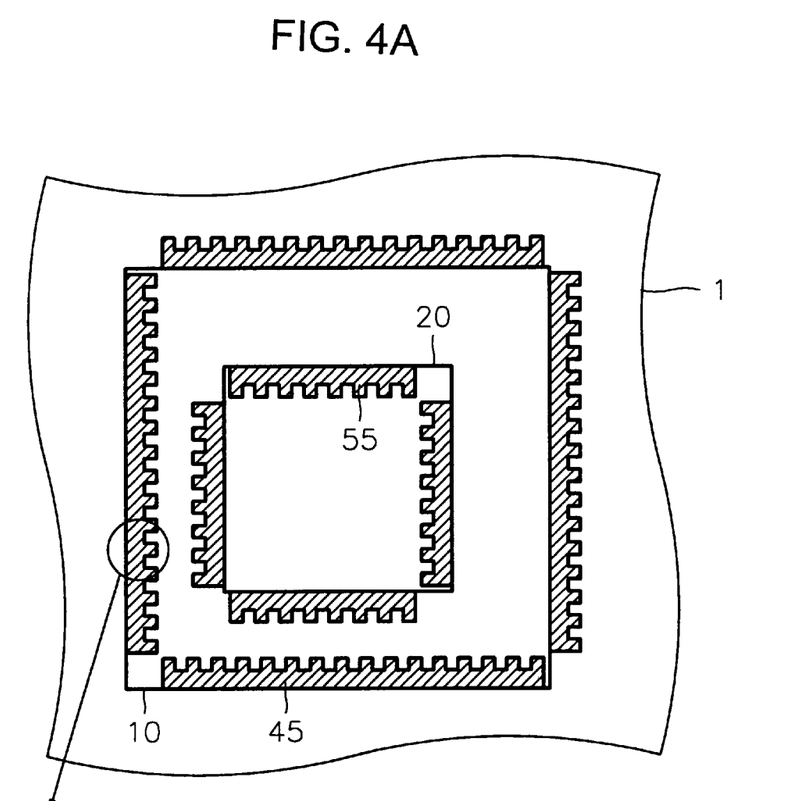
FIG. 4 is a plan view showing part of a focus test mask according to a second embodiment of the present invention.
Figure 4B:
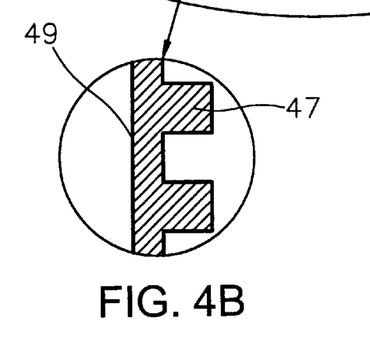

FIG. 4 is a plan view showing part of a focus test mask according to a second embodiment of the present invention.

The focus test mask according to the second embodiment is different from the focus test mask according to the first embodiment in that the first and second focus test light shielding patterns 45 and 55 have line and space patterns 47.

Preferably, the line and space patterns 47 are formed on line patterns 49 formed to a predetermined thickness along the edges of the first and second quadrilateral shapes 10 and 20. The line patterns 49 are supplementary patterns having a sufficient width such that the pattern thereof is constant even in a defocused state.

In general, when fabricating a light shielding pattern of a mask using E-beams, a slant pattern is always formed at an angle of 45°. Thus, forming a focus test mask can be achieved easily by using the line and space patterns 47 according to the second embodiment compared to using the fine protruding patterns 17 of the first embodiment having triangular or trapezoid shapes.

Figure 5:
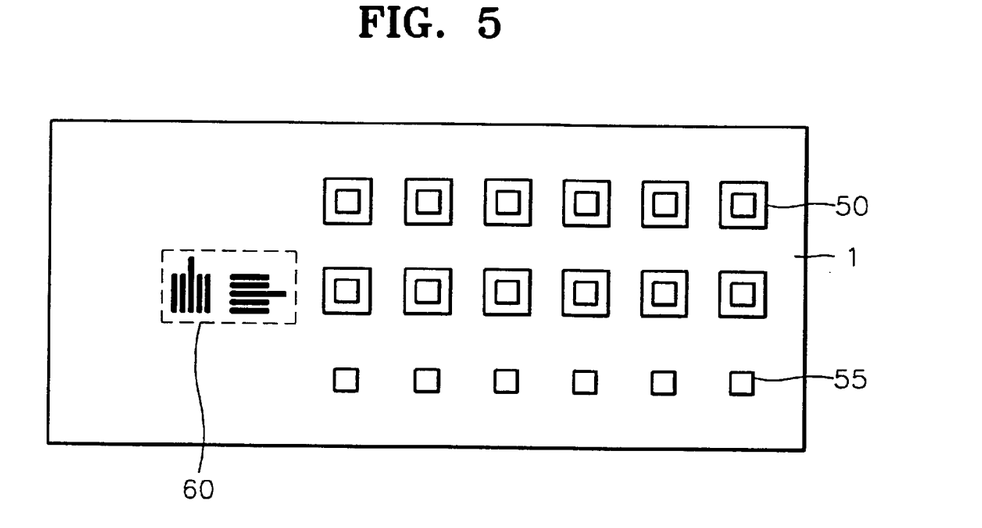
FIG. 5 is a plan view of a unit cell for a focus test mask, having test patterns and reference patterns of various sizes.

Referring to FIG. 5, a unit cell of the focus test mask includes focus test patterns 50 of different sizes, and contact hole patterns 55 and line and space patterns 60 as reference patterns used to compare change in profile according to the change in focus. Preferably, two adjacent focus test patterns 50 have the same size and each has different reduction projection ratio.

For example, when the pattern of FIG. 4 is used as the focus test pattern 50, line length and pitch of the line and space pattern 47 are varied, thereby forming focus test patterns 50 having different sizes.

Figure 6:
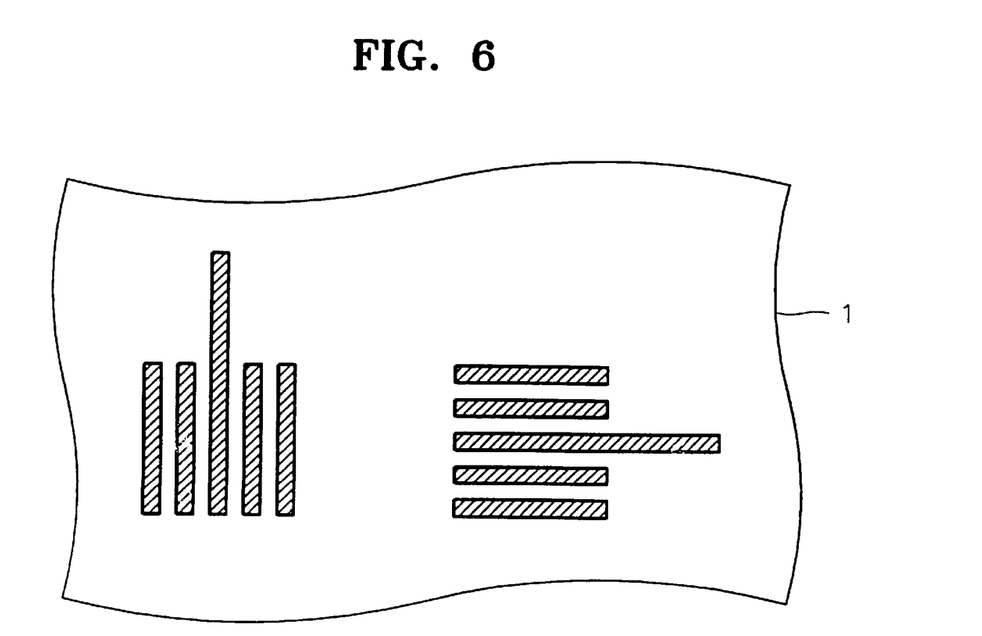
FIG. 6 is a plan view of a reference pattern formed in the unit cell of FIG. 5.

Preferably, the line and space patterns 60 as references are formed in the shape of the pattern shown in FIG. 6.

Figure 7:
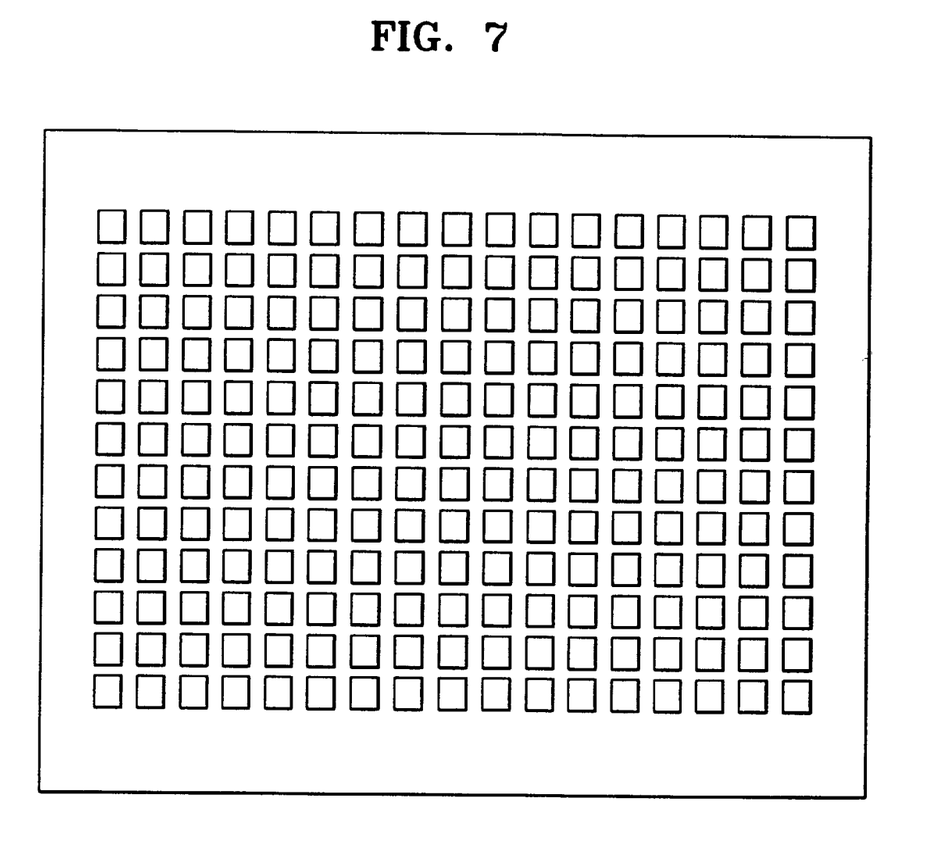
FIG. 7 is a plan view of a complete focus test mask in which the unit cells of FIG. 5 are repeatedly arranged.

FIG. 7 is a plan view of a complete focus test mask in which 17×14 unit cells of FIG. 5 are arranged.

By using the focus test mask shown in FIG. 7, the optimal focus at all points within a field of a projection object can be measured, and field curvature and field astigmatism can be calculated from the measured optimal focus.

Also, when the focus test pattern is formed on the actual mask for manufacturing a semiconductor device, the focus can be automatically measured in-situ during exposure, and thus monitoring of whether the optimal focus is maintained is directly performed. Then, the monitoring result is fed back into the exposure process to carry out normal exposure.

Figure 8:
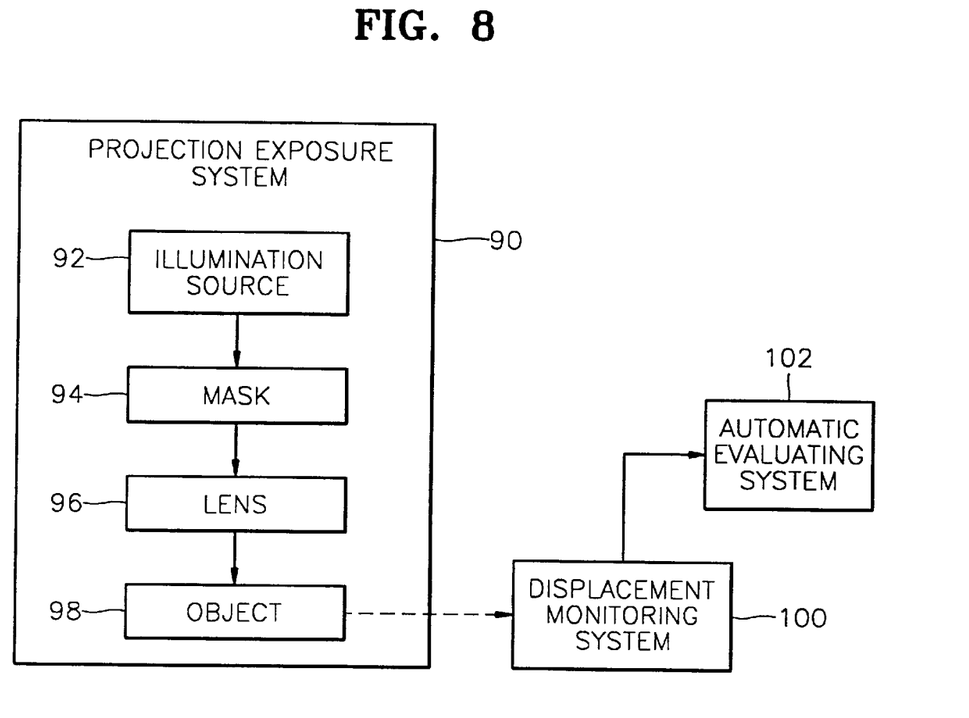
FIG. 8 is a block diagram of a focus monitoring system according to the present invention.

FIG. 8 is a block diagram of an optimal focus monitoring system for a projection exposure system according to the present invention.

Referring to FIG. 8, the optimal focus monitoring system includes an projection exposure system 90 and a displacement measuring monitoring system 100 for measuring displacement of a test pattern projected onto the object 98. The projection exposure system 90 includes an illumination source 92, a focus test mask 94, a focus lens 96 and a projection object 98 to be exposed, e.g., a wafer onto which photoresist is deposited. Preferably, the displacement monitoring system 100 is an automatic overlay metrology system.

The displacement value measured by the displacement monitoring system 100 and the focus at that time are input to an automatic evaluating system 102. Thus, when the displacement values measured at a plurality of focus values are input to the automatic evaluating system 102, the optimal focus and astigmatism can be calculated.

Figure 9:
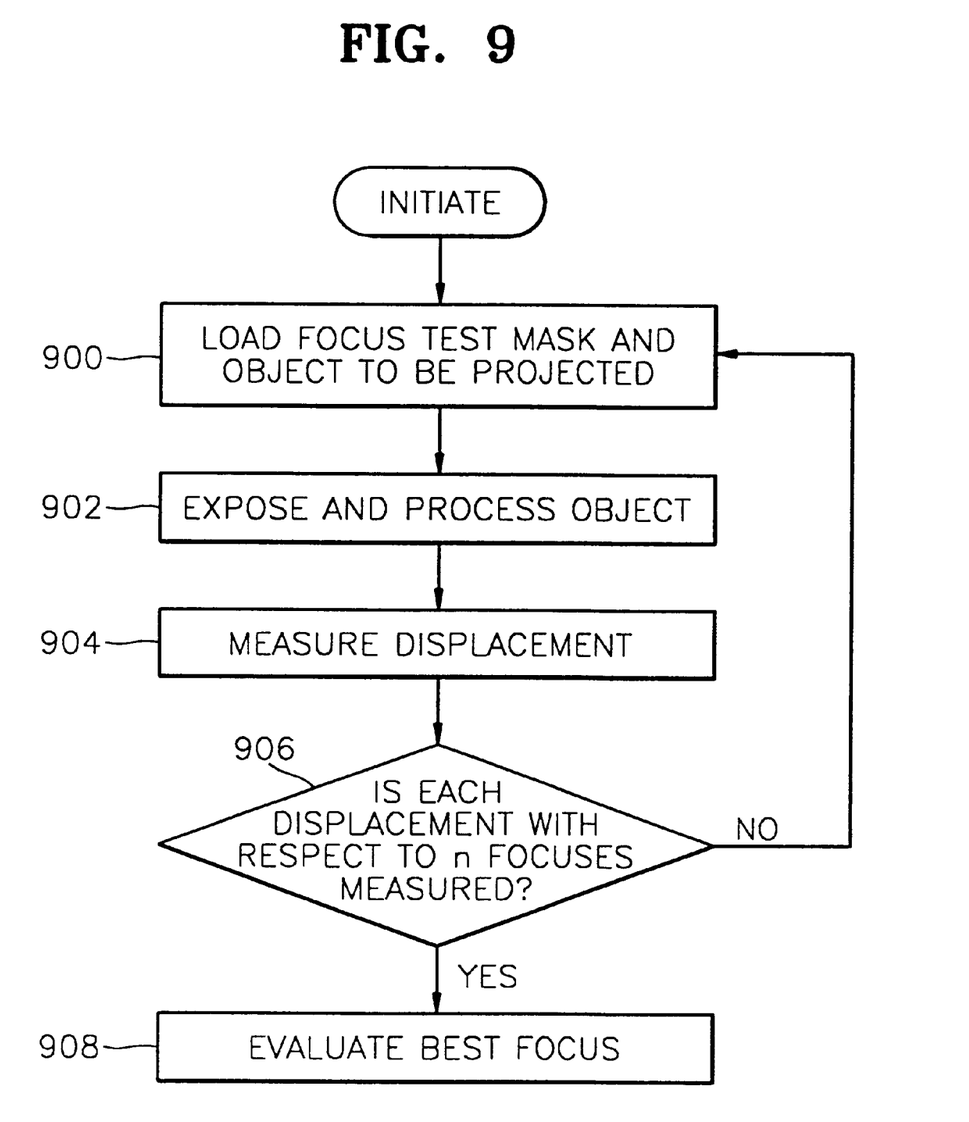
FIG. 9 is a flowchart illustrating a focus monitoring method according to the present invention.

FIG. 9 is a flowchart illustrating a method for measuring the optimal focus using the optimal focus monitoring system shown in FIG. 8.

First, the focus test mask 94 and the projection object 98, e.g., a wafer onto which a photoresist film is deposited, are loaded onto the projection exposure system 90 in step 900. Then, light is irradiated onto the focus test mask 94 from the illumination source 92, to project a test pattern formed on the mask 94 onto the object 98 via the focus lens 96. Then, general processes such as baking and developing are performed to form the test pattern projected onto the object 98, e.g., a photoresist film pattern, on the surface of the wafer, in step 902. Then, the displacement monitoring system 100, adopting an overlay metrology system, measures the displacement of the projected test pattern in step 904. The steps 900 through 904 are repeated while changing the focus, in step 906, until the displacement measurement of n focuses is completed. The displacement values obtained through the above steps and the focus values are input to the automatic evaluating system 102 to determine the optimal focus, in step 908. Also, the optimal focuses at a plurality of points on the object 98 are measured to calculate field curvature and astigmatism of the object.

The present invention will be described with reference to the following examples. However, the present invention is not limited to these examples.

EXAMPLE 1

In order to investigate whether or not line shortening occurs when a focus test pattern of the present invention is defocused, the following simulation was performed. A KrF excimer laser having a numerical aperture (NA) of 0.5, which uses a 248 nm wavelength, was used as an exposure system, and the focus test mask shown in FIG. 1 was used as a focus test mask. While varying the focus to −1.0, −0.5, 0.0, 0.5 and 1.0, wafers each having a photoresist film were exposed, thereby forming photoresist pattern on the wafers.

Figure 10:
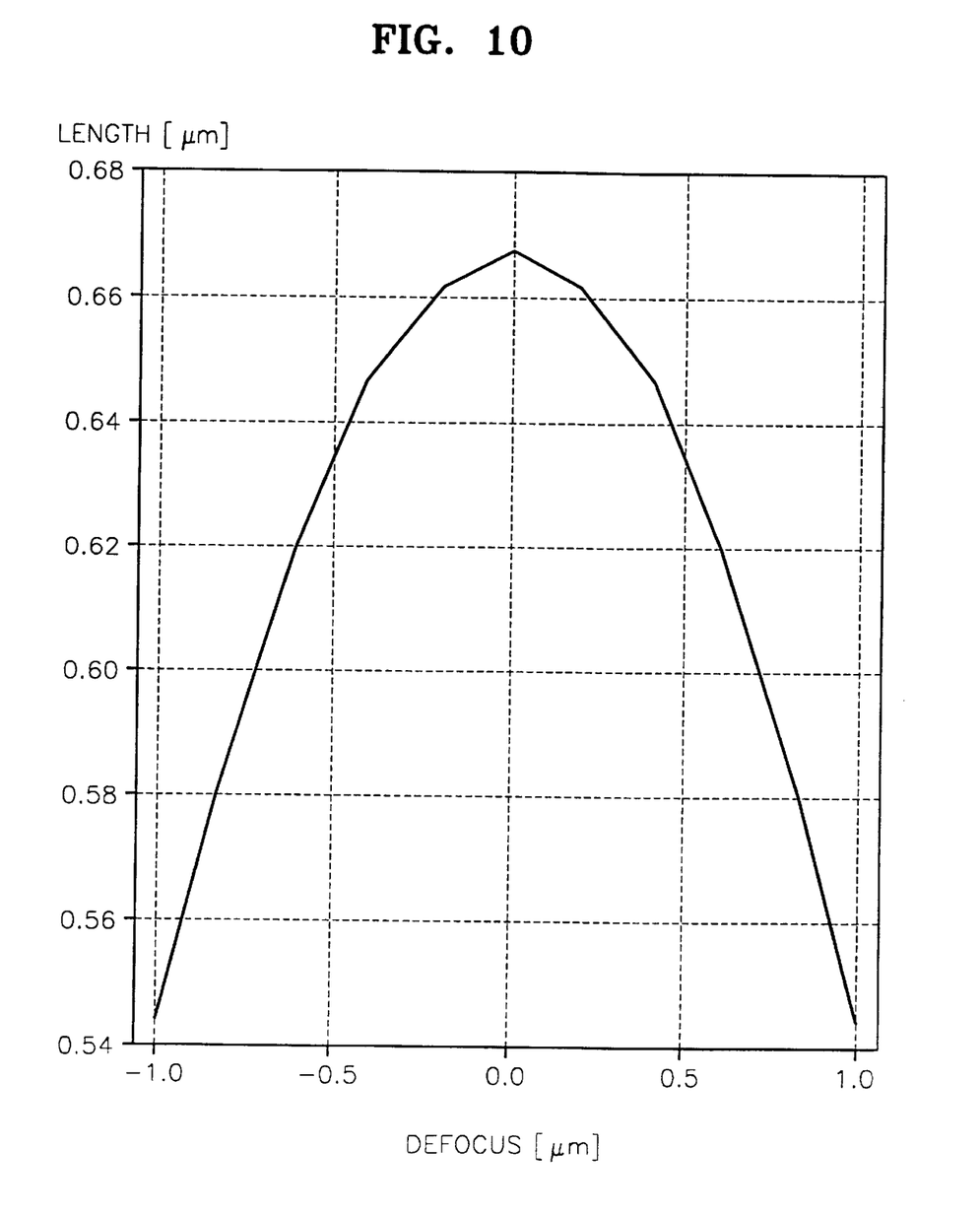
FIG. 10 is a graph showing the relationship between focus and line shortening of a fine protruding pattern of the focus test mask of FIG. 1.

The lengths of fine protruding patterns 17 (see FIG. 1 ) in the formed photoresist pattern were measured, and the results are shown in FIG. 10. From the graph of FIG. 10, it could be understood that the lengths of the fine protruded patterns became short by 0.01 $\mu$m as the focus was shifted by 0.1 $\mu$m. Also, it was obvious that the focus test mask according to the present invention was suitable to be used for measuring the displacement using an overlay metrology system.

Figure 11:
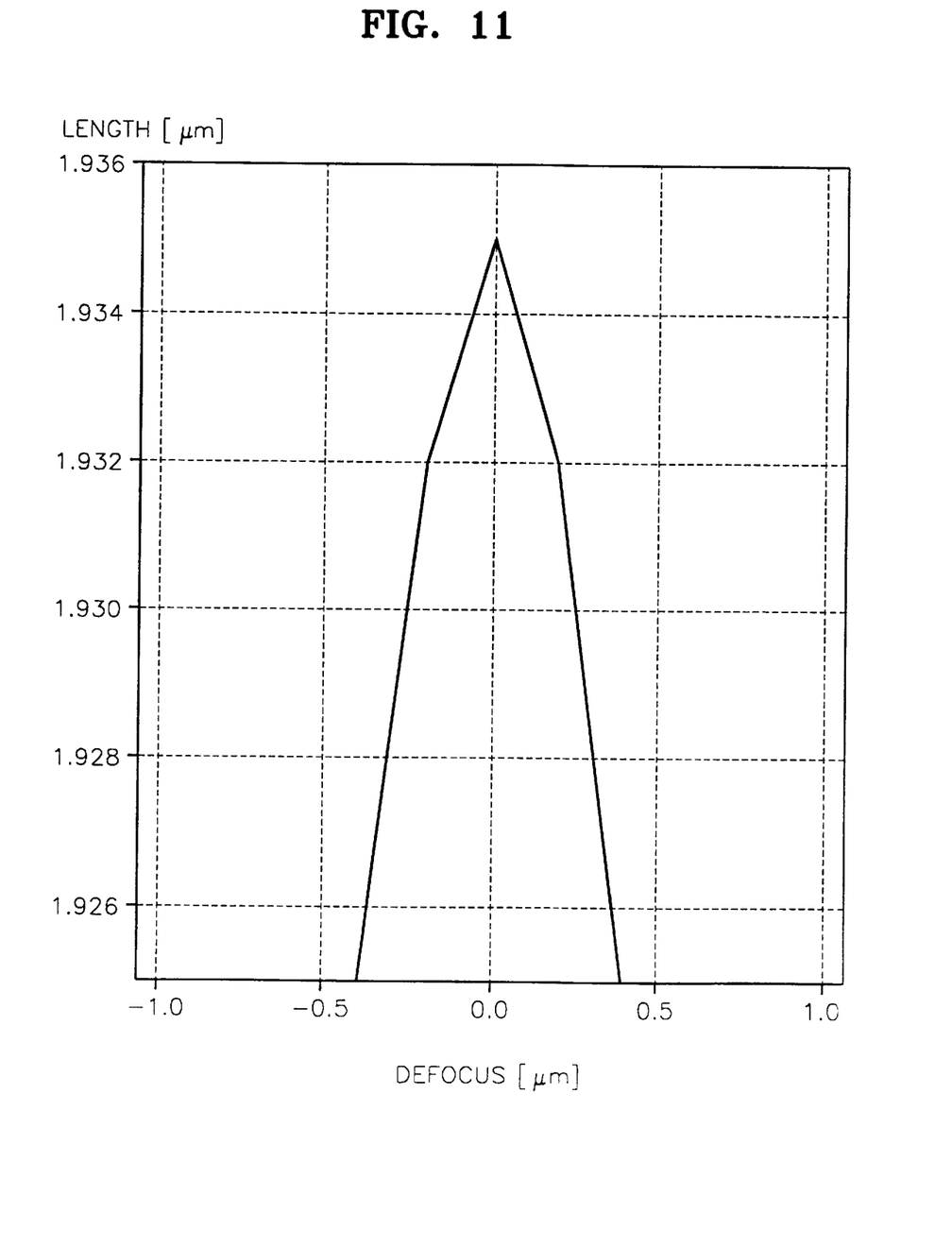
FIG. 11 is a graph showing the relationship between focus and line shortening of a fine protruding pattern of the focus test mask of FIG. 4.

Photoresist patterns were formed by the same method as above, except that the focus test mask of FIG. 4 was used. Then, the change in length of the line and space patterns 47 (see FIG. 4) was measured, and the results are shown in FIG. 11. Although the degree of line shortening was less than the result of FIG. 10, the mask shown in FIG. 4 was also suitable to be used for measuring the displacement using an overlay metrology system.

EXAMPLE 2

A mask having line and space patterns of length 15 $\mu$m, width 0.3 $\mu$m and pitch 0.9 $\mu$m, was used as a focus test pattern, and the exposure was performed under the same conditions as in the first embodiment. Displacement of the test pattern at 25 points on the wafer was measured. Here, the focus was varied to 0.6, 0.3, 0.0, −0.3, −0.6 in both X- and Y-axis directions. The focus values and measured displacement values at 16 points among the twenty-five points are shown in FIGS. 12 and 13.

Figure 12:
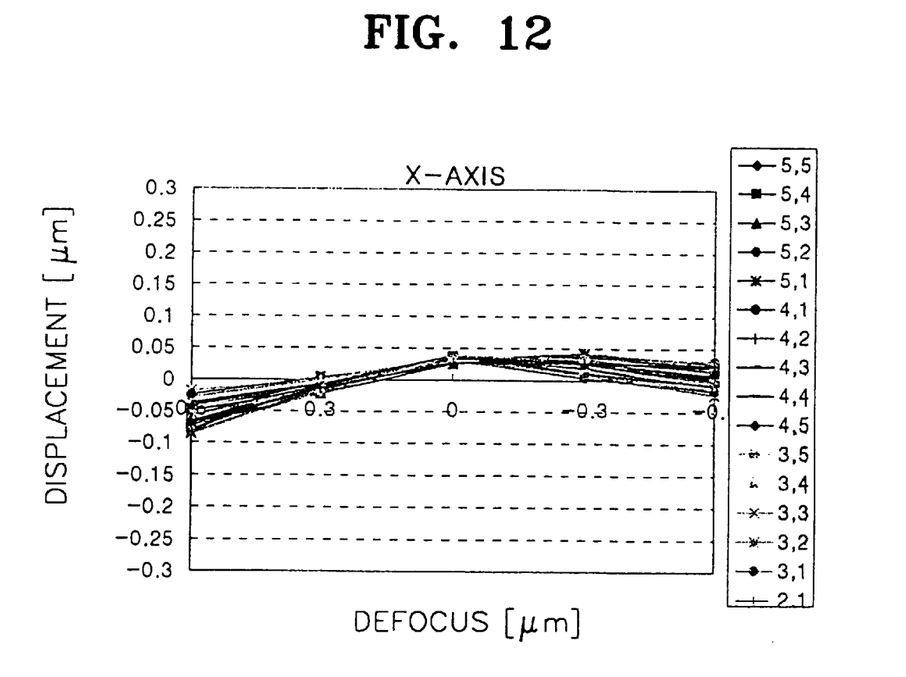
FIG. 12 is a graph showing the relationship between focus of the X-axis and displacement of a projected test pattern, measured at sixteen points on a wafer.
Figure 13:
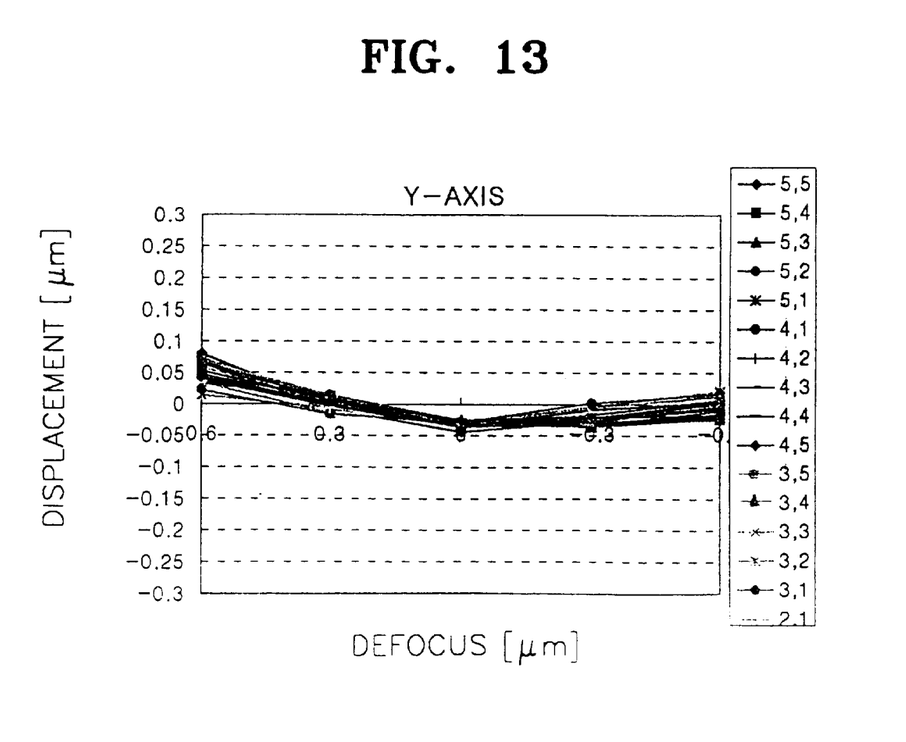
FIG. 13 is a graph showing the relationship between focus of the Y-axis and displacement of a projected test pattern, measured at sixteen points on a wafer.
Figure 14:
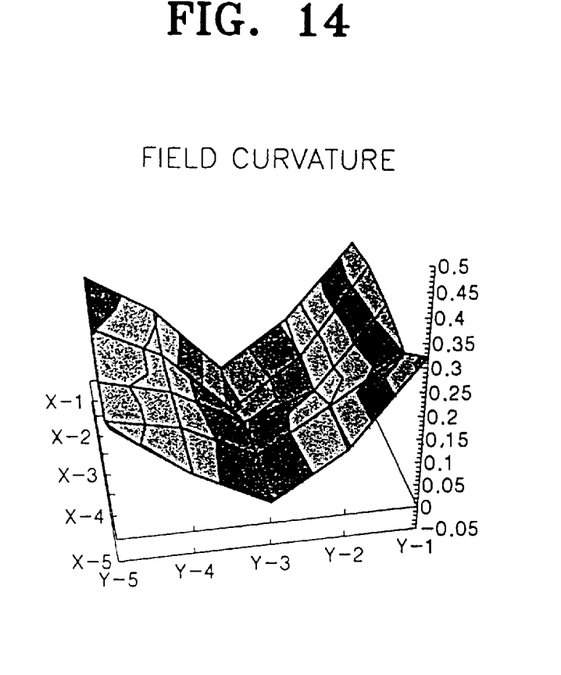
FIG. 14 is a graph showing a field curvature obtained from the results shown in FIGS. 12 and 13.
Figure 15:
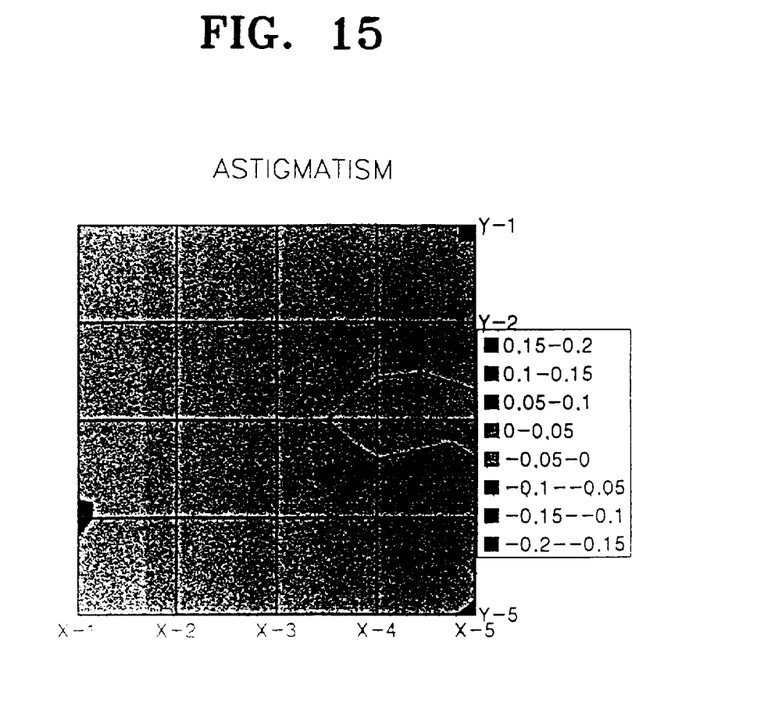
FIG. 15 is a graph showing a field astigmatism obtained from the results of FIGS. 12 and 13.

From the results of FIGS. 12 and 13, the optimal focuses at sixteen points can be determined. Also, field curvature and field astigmatism obtained from the determined optimal focuses are shown in FIGS. 14 and 15.

As described above, the focus test pattern mask for a projection exposure system according to the present invention can be applied to a general light shielding pattern mask. Also, the optimal focus values of the projection exposure system can be easily determined using an overlay metrology system, and the field curvature and astigmatism can be easily it obtained from the result. Also, after periodically monitoring focus using the focus test mask according to the present invention, the result can be immediately applied to an actual process, thereby reducing the time required for maintaining the optimal focuses of the projection exposure system.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. A focus test mask for a projection exposure system, comprising;

a substrate which is transparent with respect to an illumination source;

a first light shielding pattern for focus test formed on the substrate in a first quadrilateral shape, in which plurality of fine protruding patterns are repeatedly arranged along edges of the first quadrilateral pattern, such that fine patterns on facing edges of the first quadrilateral shape protrude in the same direction; and a second light shielding pattern for focus test placed inside the first quadrilateral shape and formed on the substrate in a second quadrilateral shape, in which plurality of fine protruding patterns are repeatedly arranged along edges of the second quadrilateral shape, such that fine patterns on edges of the second quadrilateral shape protrude in an opposite direction to a protruding direction of fine patterns on a directly neighboring edge of the first quadrilateral shape.

2. The focus test mask of claim 1, wherein the fine protruding pattern is one of a triangular pattern, a rectangular pattern and a trapezoid pattern.

3. The focus test mask of claim 1, wherein the fine protruding pattern is a line and space pattern.

4. The focus test mask of claim 1, wherein centers of first and second closed geometric shapes coincide with each other.

5. The focus test mask of claim 1, wherein the first and second quadrilateral shapes are square or rectangular.

6. The focus test mask of claim 1, wherein the focus test mask further comprises a line and space pattern as a reference.

7. A focus monitoring system for monitoring focus of a projection exposure system having an illumination source and a focus lens, the focus monitoring system comprising:

a focus test mask positioned between the illumination source and the focus lens, the focus test mask having a substrate which is transparent with respect to an illumination source, and a first light shielding pattern formed on the substrate in a first quadrilateral shape in which plurality of fine protruding patterns are repeatedly arranged along edges of the first quadrilateral shape such that fine patterns on facing edges of the first quadrilateral shape protrude it the same direction, and a second light shielding pattern placed inside the first quadrilateral shape in which plurality of fine protruding patterns are repeatedly arranged along edges of the second quadrilateral shape, such that fine patterns on edges of the second quadrilateral shape protrude in an opposite direction to a protruding direction of fine patterns on a directly neighboring edge of the first quadrilateral shape; and a displacement monitoring system for measuring displacement of the first and second light shielding patterns projected onto the surface of the object via the focus lens.

8. The focus monitoring system of claim 7, wherein the displacement monitoring system is an automatic overlay metrology system which measures the displacement of the focus test pattern projected onto the surface of the object.

9. A method for measuring focus in a projection exposure system, comprising:

loading a focus test mask having a substrate which is transparent with respect to an illumination source, and a first light shielding pattern formed on the substrate in a first quadrilateral shape in which plurality of fine protruding patterns are repeatedly arranged along edges of the first quadrilateral shape such that fine patterns on facing edges of the first quadrilateral shape protrude it the same direction, and a second light shielding pattern placed inside the first quadrilateral shape in which plurality of fine protruding patterns are repeatedly arranged along edges of the second quadrilateral shape that fine patterns on edges of the second quadrilateral shape protrude in an opposite direction to a protruding direction of fine patterns on a directly neighboring edge of the first quadrilateral shape, wherein the first and second light shielding patters are projected onto the surface of an object, to allow quantitative measurement of the optimal focus of the projection exposure system, above a focus lens of the projection exposure system;

exposing the focus test mask to project the focus test pattern onto the surface of the object through the focus lens; and measuring a displacement of the first and second light shielding patterns projected onto the surface of the object.

10. The method of claim 9, further comprising calculating an optimal focus based on the relationship between the measured focus and the displacement after repeating the loading, exposing and measuring while varying the focus of the focus lens.

11. The focus test mask of claim 1, wherein a supplementary pattern having width not to induce the change of pattern even in a defocused state, is formed on the respective edges of the first or second quadrilateral shape.

12. The focus test mask of claim 1, wherein the first or second light shielding pattern can be respectively placed on the edges of the first or second quadrilateral shape such that at least one of the corners of the first or second quadrilateral shape is open.

* * * * *